(12) United States Patent
Park (10) Patent No.: US 7,541,284 B2
(45) Date of Patent: Jun. 2, 2009

(54) METHOD OF DEPOSITING RU FILMS HAVING HIGH DENSITY

(75) Inventor: Hyung-Sang Park, Seoul (KR)

(73) Assignee: ASM Genitech Korea Ltd. (KR)

( * ) Notice: Subject to any disclaimer, the term of this patent is extended or adjusted under 35 U.S.C. 154(b) by 160 days.

(21) Appl. No.: 11/706,607

(22) Filed: Feb. 14, 2007

(65) Prior Publication Data
US 2007/0190782 A1    Aug. 16, 2007

(30) Foreign Application Priority Data
Feb. 15, 2006    (KR) ...................... 10-2006-0014807

(51) Int. Cl.
*H01L 21/44* (2006.01)
*H01L 29/40* (2006.01)
(52) U.S. Cl. ........................ 438/686; 438/650; 257/768; 257/769
(58) Field of Classification Search .................. 438/648, 438/650, 686; 257/768, 769, 770
See application file for complete search history.

(56) References Cited

U.S. PATENT DOCUMENTS

| | | | |
|---|---|---|---|
| 4,058,430 A | 11/1977 | Suntola et al. | |
| 4,477,296 A | 10/1984 | Nair | |
| 4,670,110 A | 6/1987 | Withers et al. | |
| 4,965,656 A | 10/1990 | Koubuchi et al. | |
| 5,382,333 A | 1/1995 | Ando et al. | |

(Continued)

FOREIGN PATENT DOCUMENTS

DE    41 08 73    3/1925

(Continued)

OTHER PUBLICATIONS

Baliga, J., Associate Editor, "New designs and materials tackle 1 Gb memory challenge," *Semiconductor International*, www.semiconductor.net, Nov. 2000.

(Continued)

*Primary Examiner*—Kevin M Picardat
(74) *Attorney, Agent, or Firm*—Knobbe Martens Olson & Bear LLP (57) ABSTRACT

A ruthenium film deposition method is disclosed. In one embodiment of the method, a first ruthenium film is deposited by using a PEALD process until a substrate is substantially entirely covered with the first ruthenium film. Then, a second ruthenium film is deposited on the first ruthenium film by using a thermal ALD process having a higher deposition speed than that of the PEALD process. In the method, a ruthenium metal film having a high density is formed in a short time by combining a PEALD process of depositing a ruthenium film at a low deposition speed and a deposition process of depositing a ruthenium film at a higher deposition speed. Accordingly, it is possible to form a ruthenium film having high density, a smooth surface, good adhesiveness, and a short incubation period. Therefore, according to the embodiment, in comparison to cases of using only a PEALD process or an ALD process that has a long incubation period, it is possible to obtain a ruthenium film having a large thickness and a high density in the same time interval. As a result, the ruthenium film formed by the ruthenium film deposition method according to the embodiment is more suitable for electrode structures of semiconductor devices than the ruthenium films formed by using conventional methods.

32 Claims, 4 Drawing Sheets

U.S. PATENT DOCUMENTS

| | | | |
|---|---|---|---|
| 5,391,517 | A | 2/1995 | Gelatos et al. |
| 5,637,533 | A | 6/1997 | Choi |
| 5,711,811 | A | 1/1998 | Suntola et al. |
| 5,731,634 | A | 3/1998 | Matsuo et al. |
| 5,865,365 | A | 2/1999 | Nishikawa et al. |
| 5,916,365 | A | 6/1999 | Sherman |
| 5,923,056 | A | 7/1999 | Lee et al. |
| 5,939,334 | A | 8/1999 | Nguyen et al. |
| 6,006,763 | A | 12/1999 | Mori et al. |
| 6,033,584 | A | 3/2000 | Ngo et al. |
| 6,066,892 | A | 5/2000 | Ding et al. |
| 6,124,189 | A | 9/2000 | Watanabe et al. |
| 6,130,123 | A | 10/2000 | Liang et al. |
| 6,144,060 | A | 11/2000 | Park et al. |
| 6,203,613 | B1 | 3/2001 | Gates et al. |
| 6,294,467 | B1 | 9/2001 | Yokoyama et al. |
| 6,297,539 | B1 | 10/2001 | Ma et al. |
| 6,303,500 | B1 | 10/2001 | Jiang et al. |
| 6,305,314 | B1 | 10/2001 | Sneh et al. |
| 6,320,213 | B1 | 11/2001 | Kirlin et al. |
| 6,323,131 | B1 | 11/2001 | Obeng et al. |
| 6,342,277 | B1 | 1/2002 | Sherman |
| 6,346,151 | B1 | 2/2002 | Jiang et al. |
| 6,359,159 | B1 | 3/2002 | Welch et al. |
| 6,433,432 | B2 | 8/2002 | Shimizu |
| 6,444,568 | B1 | 9/2002 | Sundararajan et al. |
| 6,482,740 | B2 | 11/2002 | Soininen et al. |
| 6,511,539 | B1 | 1/2003 | Raaijmakers |
| 6,576,053 | B1 | 6/2003 | Kim et al. |
| 6,593,656 | B2 | 7/2003 | Ahn et al. |
| 6,680,540 | B2 | 1/2004 | Nakano et al. |
| 6,720,262 | B2 | 4/2004 | Koh et al. |
| 6,849,122 | B1 | 2/2005 | Fair |
| 6,936,535 | B2 | 8/2005 | Kim et al. |
| 7,011,981 | B2 | 3/2006 | Kim et al. |
| 7,273,814 | B2 * | 9/2007 | Matsuda ............ 438/680 |
| 7,438,949 | B2 | 10/2008 | Weidman |
| 2001/0003064 | A1 | 6/2001 | Ohto |
| 2001/0013617 | A1 | 8/2001 | Toyoda et al. |
| 2001/0018266 | A1 | 8/2001 | Jiang et al. |
| 2001/0030366 | A1 | 10/2001 | Nakano et al. |
| 2001/0052318 | A1 | 12/2001 | Jiang et al. |
| 2002/0013487 | A1 | 1/2002 | Norman et al. |
| 2002/0027286 | A1 | 3/2002 | Sundararajan et al. |
| 2004/0152255 | A1 | 8/2004 | Seidl et al. |
| 2004/0224475 | A1 * | 11/2004 | Lee et al. ............ 438/399 |
| 2005/0124154 | A1 | 6/2005 | Park et al. |
| 2005/0208754 | A1 | 9/2005 | Kostamo et al. |
| 2006/0013955 | A1 | 1/2006 | Senzaki |
| 2006/0093848 | A1 | 5/2006 | Senkevich et al. |
| 2006/0177601 | A1 | 8/2006 | Park et al. |
| 2006/0263977 | A1 * | 11/2006 | Kim et al. ............ 438/253 |

FOREIGN PATENT DOCUMENTS

| | | |
|---|---|---|
| EP | 0 469 470 A1 | 2/1992 |
| EP | 0 880 168 A2 | 11/1998 |
| GB | 2 340 508 A | 2/2000 |
| WO | WO 93/10652 | 5/1993 |
| WO | WO 00/03420 | 1/2000 |
| WO | WO 2004/035858 | 4/2004 |

OTHER PUBLICATIONS

Basceri, C. Ph.D. thesis, "Electrical and Dielectric Properties of (BA,SR) TiO$_3$ Thin Film Capacitors for Ultra-High Density Dynamic Random Access Memories," 1997, pp. 13-31, Raleigh, N.C. State University.

Bursky, D., "Hit Up IEDM For Gigabit And Denser DRAMs And Merged Logic/Memory," *Electronic Design*, World Wide Web address: planetee.com, Dec. 1, 1998.

Campbell, S.A. et al., "Titanium dioxide (TiO$_2$)-based gate insulators," *IBM J. Res. Develop.*, May 1999, vol. 43, No. 3, pp. 383-392.

Fukuzumi, Y. et al., "Liner-Supported Cylinder (LSC) Technology to Realize Ru/Ta$_2$O$_5$/Ru Capacitor for Future DRAMs," *IEEE*, 2000, IED 2000, Session 34.

Hones, P. et al., "MOCVD of Thin Ruthenium Oxide Films: Properties and Growth Kinetics," *Chem. Vap. Deposition*, 2000, vol. 6, No. 4, pp. 193-198.

Inoue, N. et al., "Low thermal-budget fabrication of sputtered-PZT capacitor on multilevel interconnects for embedded FeRAM," *IEEE*, IED 2000, 2000, Session 34.

Jung, D. et al., "A Novel Ir/IrO$_2$/Pt-PZT-Pt/IrO$_2$/Ir Capacitor for a Highly Reliable Mega-Scale FRAM," *IEEE*, IED 2000, 2000, Session 34.

Kawamoto, Y. et al., "The Outlook for Semiconductor Processes and Manufacturing Technologies in the 0.1-μm Age," *Hitachi Review*, 1999, vol. 48, No. 6, pp. 334-339.

Onda, N. et al., "Hydrogen Plasma Cleaning a Novel Process for IC-Packaging," p. 311, World Wide Web Address: Semiconductor Fabtech.com, 1998.

Solanki, R. et al., "Atomic Layer Deposition of Copper Seed Layers," *Electrochemical and Solid-State Letters*, 2000, vol. 3, No. 10, pp. 479-480.

Sundani et al., "Oral presentation of dual damascene process," slides, 1998.

Utriainen, M. et al., "Studies of NiO thin film formation by atomic layer epitaxy," *Materials Science & Engineering*, 1998, vol. B54, pp. 98-103.

Utriainen, M. et al., "Studies of metallic thin film growth in an atomic layer epitaxy reactor using M(acac)$_2$ (M = Ni, Cul Pt) precursors," *Applied Surface Science*, 2000, vol. 157, pp. 151-158.

Won, Seok-Jun et al., "Conformal CVD-Ruthenium Process for MIM Capacitor in Giga-bit DRAMs," *IEEE*, IED 2000, 2000, Session 34.

Xu, P. et al., "A Breakthrough in Low-k Barrier/Etch Stop Films for Copper Damascene Applications," *Semiconductor Fabtech*, 2000, 11th Edition, p. 239.

Yagishita et al., "Cleaning of Copper Surface Using Vapor-Phase Organic Acids," *MRS Proceedings*, vol. 766, MRS Spring 2003 Meeting, Apr. 21-25, 2003, Symposium E, Session E3, Paper E3.28.

Yoon, Dong-Soo et al., "Tantalum-ruthenium dioxide as a diffusion barrier between Pt bottom electrode and TiSi$_2$ ohmic contact layer for high density capacitors," *Journal of Applied Physics*, 1999, vol. 86, No. 5, pp. 2544-2549.

Yoon, Dong-Soo et al., "Investigation of RuO$_2$-Incorporated Pt Layer as a Bottom Electrode and Diffusion Barrier for High Epsilon Capacitor Applications," *Electrochemical and Solid-State Letters*, 2000, vol. 3, No. 8, pp. 373-376.

Yoon, Y.-G. et al., 197th Meeting Program Information II, The Electrochemical Society, 197th Meeting—Toronto, Ontario, Canada, May 14-18, 2000, Program Information, I1—Rapid Thermal and Other Short-Time Processing Technologies I, Electronics Division/Dielectric Science and Technology Division/High Temperature Materials Division, 2000, Wednesday, May 17, 2000, New Applications of RTP, Co-Chairs: A. Fiory and D.-L Kwong, time 11:10 Abs#550, Title: Development of RTA Process for the Crystallization of a-Si Thin Film—Y.-G. Yoong, T.-K. Kim, K.-B. Kim J.-Y. Chio, B.-I Lee, and S.-K. Joo (Seoul National Univ.).

Integrated Circuit Engineering Corporation, Practical Integrated Circuit Fabrication Seminar (1998).

NEC Device Technology International, No. 48, pp. 4-8 (1998).

SOI Technology: IBM's Next Advance in Chip Design. Date unknown, 1998.

Winbond News Release, World Wide Web address: winbond.com (Dec. 13, 2000).

Office Action issued Mar. 17, 2009 in U.S. Appl. No. 11/182,734.

* cited by examiner

METHOD OF DEPOSITING RU FILMS HAVING HIGH DENSITY

PRIORITY CLAIM

This application claims the priority benefit of Korean Patent Application No. 10-2006-0014807, filed on Feb. 15, 2006, the disclosure of which is incorporated herein by reference.

BACKGROUND

1. Field

The present invention relates to a method of depositing a ruthenium (Ru) film, and more particularly, to a method of manufacturing semiconductor devices with Ru films having high density.

2. Description of the Related Art

Ruthenium films have been proposed to be used for thin film electrodes of semiconductor devices such as dynamic random access memories (DRAMs) and ferroelectric random access memories (FeRAMs). Ruthenium films to be used for the electrodes typically have a thickness of about 10 nm to about 20 nm.

A ruthenium film can also serve as a barrier against diffusion of copper in semiconductor devices. In such a case, a ruthenium film can be in contact with a copper layer. In addition, a ruthenium film may serve to increase adhesion of a copper layer or prevent electromigration of copper. In these cases, the ruthenium films may have a thickness of about 10 nm or less, and particularly, about 3 nm or less.

In certain cases, there is a need to prevent oxidation of a substrate during formation of a ruthenium film. In a case where a ruthenium film is used for copper interconnections having a double damascene structure, the ruthenium film is formed in a non-oxidation ambience in order to prevent oxidation of exposed copper on the bottoms of vias or a copper diffusion barrier film (a metallic film such as metal nitride).

Generally, a ruthenium film can be deposited using a chemical vapor deposition (CVD) method or a thermal atomic layer deposition (ALD) method. The CVD method includes simultaneously supplying a ruthenium source gas and oxygen gas ($O_2$). The ALD method includes sequentially supplying a ruthenium source gas and oxygen gas ($O_2$) (see T. Aaltonen, P. Alen, M. Ritala, and M. Leskela, "RUTHENIUM THIN FILMS GROWN BY ALD, Chemical Vapor Deposition, 2003, 9, No. 1, pp. 45-49). The ALD method may include repeating a gas supplying cycle. The gas supplying cycle can include sequences of pulses in each cycle, such as a ruthenium source gas supplying step, an inert gas reactor-purging step, an oxygen gas ($O_2$) supplying step, and an inert gas reactor-purging step. Examples of the ruthenium source include $Ru(Cp)_2$, $Ru(EtCp)_2$, $Ru(acac)_3$, $Ru(thd)_3$, $Ru(OD)_3$, and the like, wherein Cp is cyclopentadienyl, EtCp is ethylcyclopentadienyl, acac is acetylacetonate, thd is 2,2,6,6-tetramethyl-3,5-heptanedionate, and OD is 2,4-octanedionate. In addition, liquid ruthenium sources such as $Ru(EtCp)_2$ and $Ru(OD)_3$ are more suitable for mass production than solid ruthenium sources.

A ruthenium film formed by the CVD method using the ruthenium source gas and oxygen gas ($O_2$) has a density of 6.6 $g/cm^3$, which is much lower than a bulk density of ruthenium metal, that is, 12.37 $g/cm^3$. The ruthenium film having a low density may be contracted or deformed in a subsequent thermal process. On the other hand, a ruthenium film formed by the ALD method has a density of 8.7 $g/cm^3$, which is higher than the density of the ruthenium film formed by the CVD method.

A plasma-enhanced ALD (PEALD) method can also be used for forming a ruthenium film. The PEALD method includes repeating a gas cycle. The gas cycle can include a ruthenium source gas supplying step, an inert gas reactor-purging step, a plasma-activated ammonia gas ($NH_3$) supplying step, and an inert gas reactor-purging step (see U.S. Patent Application Publication No. 2006-0177601, published Aug. 10, 2006, entitled "METHOD OF FORMING A RUTHENIUM THIN FILM USING A PEALD APPARATUS AND THE METHOD THEREOF," by Park and Kang). A ruthenium film formed by the PEALD method has a density of 12.0 $g/cm^3$, which is substantially equal to a bulk density of ruthenium metal, that is, 12.37 $g/cm^3$.

Another PEALD method can be used for forming a ruthenium film. This method includes repeating a gas supplying cycle including a ruthenium source gas supplying step, an inert gas reactor-purging step, an oxygen gas ($O_2$) supplying step, an inert gas reactor-purging step, a hydrogen gas ($H_2$) supplying step, and an inert gas reactor-purging step (see Korean Patent Application No. 10-2001-0086955; Korean Patent Publication No. 10-2003-0056677; and U.S. Patent Application Publication No. 2005-0124154 A1 published Jun. 9, 2005). A ruthenium film formed by the PEALD method has a density of 12.0 $g/cm^3$. In addition, the PEALD methods provide more uniform films than the CVD or thermal ALD method (hereinafter, collectively referred to as a non-plasma ALD method) which does not use plasma.

In order to be used as an electrode of a highly-integrated semiconductor device, a ruthenium film needs to have a relatively uniform thickness on a structure having a large aspect ratio. It is well-known that a film having good step coverage can be formed by the CVD method. However, a ruthenium film may not be formed uniformly in a narrow, deep structure by the CVD method.

In order to obtain good step coverage, a ruthenium film may be deposited by an ALD method which is performed by repeating a gas supplying cycle of sequentially supplying a metal source gas and a reaction gas.

However, the ruthenium film may not be formed on a metal oxide layer such as $SiO_2$, $Al_2O_3$, $HfO_2$, and $ZrO_2$ immediately by the thermal ALD method. An initial period during which there is effectively no film deposition is called the incubation time of ALD. Typically, the incubation time of Ru thermal ALD on a metal oxide layer includes about 100 to about 200 ALD gas supplying cycles.

Because the incubation time is long and inconsistent, the thickness of the resulting ruthenium film may vary significantly after a fixed number of Ru thermal ALD gas supplying cycles. In addition, the long incubation time can decrease the productivity of the Ru ALD apparatus. On the other hand, in the PEALD method, since the incubation period is as short as several to twenty gas supplying cycles, the ruthenium film can be formed in a short period of time after the PEALD starts.

Figure 1:
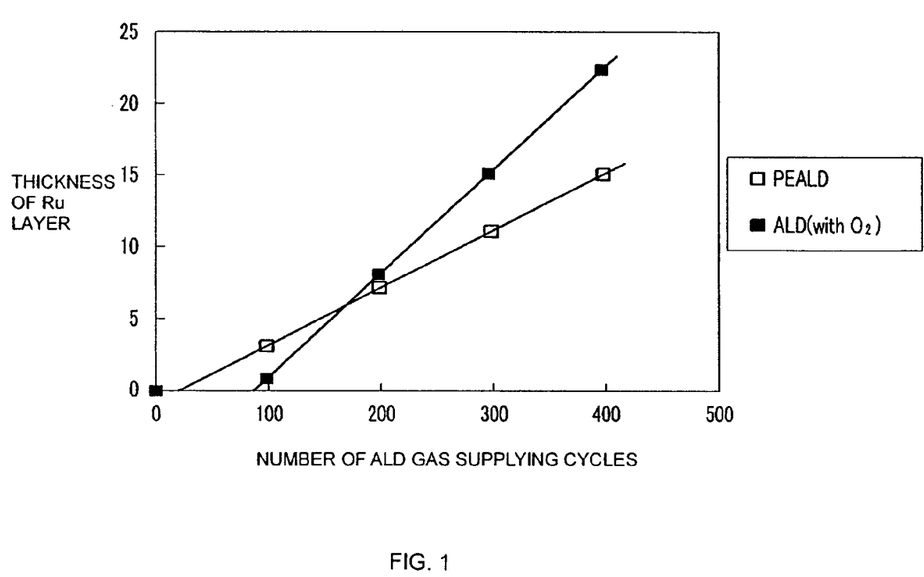
FIG. 1 is a graph showing relationships between the number of gas supplying cycles and the thicknesses of ruthenium films formed by a thermal ALD method and a PEALD method.

Now, examples of depositing a ruthenium film by a thermal ALD method or a PEALD method will be described with reference to FIG. 1. FIG. 1 is a graph showing relationships between the number of gas supplying cycles and thicknesses of ruthenium films formed by each of the thermal non-plasma ALD method and the PEALD method. Referring to FIG. 1, an initial film deposition speed of the PEALD method is higher than that of the thermal non-plasma ALD method.

In addition, in the PEALD method, the thickness of the deposited ruthenium film can be easily controlled by adjusting the number of the gas supplying cycles. Since the density of the deposited ruthenium film is 12.0 g/cm³, which is substantially equal to the bulk density of the ruthenium metal, that is, 12.1 g/cm³, the ruthenium film tends not to be deformed during subsequent thermal processing. In addition, the ruthenium film having a good adhesiveness and a smooth surface can be obtained. Therefore, the ruthenium film is suitable for an electrode having a very narrow structure which is required for a next generation memory device.

On the other hand, in the PEALD method which does not use oxygen gas, a ruthenium metal film having a high density can be formed without oxidation of a substrate. For example, in a case where a ruthenium film to be used as an electrode is electrically connected to titanium nitride (TiN) that is locally exposed to the substrate, the ruthenium film should be formed without oxidation of the substrate.

However, as shown in FIG. 1, at a deposition phase in which the film deposition is constant after the incubation period, the film deposition (about 0.04 nm or less per gas supplying cycle) in the PEALD method is slower than the film deposition (about 0.05 nm to 0.15 nm per gas supplying cycle) in the non-plasma ALD method. Therefore, it takes longer to form a thick ruthenium film by the PEALD method than by the non-plasma ALD method.

Another ruthenium film formation method is disclosed in Korean Patent Application No. 10-2003-0019258 and U.S. Patent Application Publication No. 2004/0224475, entitled "METHODS OF MANUFACTURING SEMICONDUCTOR DEVICES HAVING A RUTHENIUM LAYER VIA ALD AND ASSOCIATED APPARATUS AND DEVICES" by Lee Kwang-Hee et. al. The ruthenium film formation method includes a first step of forming a thin ruthenium seed film by an ALD method (which includes alternately supplying a source gas containing ruthenium and oxygen and another source gas containing hydrogen), and a second step of forming a ruthenium film having a desired thickness by a CVD method. The deposition speed per unit time of the CVD method is higher than that of the ALD method. As described above, the densities of the ruthenium films formed by the CVD method and the ALD method are 6.6 g/cm³ and 8.7 g/cm³, respectively. Therefore, the density of the ruthenium film formed by using the CVD method on the ruthenium film formed by the ALD method is less than 8.7 g/cm³.

SUMMARY

One embodiment provides a ruthenium film deposition method that is capable of depositing a ruthenium film having excellent step coverage and a high density at a high deposition speed. Another embodiment provides a ruthenium film having excellent step coverage and a high density. Yet another embodiment provides a ruthenium film deposition method that is capable of depositing a ruthenium film having a high density at a high deposition speed without oxidation of an underlying layer.

According to one embodiment, a ruthenium structure includes a first ruthenium film that covers a surface of a substrate and a second ruthenium film that is formed on the first ruthenium film, wherein the densities of the first and second ruthenium films are in a range of from about 10 g/cm³ to about 13 g/cm³.

The first ruthenium film may be deposited by a PEALD process, and the second ruthenium film may be deposited by an ALD process. In addition, the first ruthenium film may be formed by the PEALD process including steps of: supplying a first ruthenium source gas to a reactor where the substrate is loaded; purging the first ruthenium source gas from the reactor; supplying a first reaction gas that is activated with plasma to the reactor; and purging the first reaction gas from the reactor.

The first reaction gas may be a mixture gas of nitrogen and hydrogen. The first reaction gas may be ammonia gas. The first ruthenium film may be formed by the PEALD process including steps of: supplying a first ruthenium source gas to a reactor where the substrate is loaded; purging the first ruthenium source gas from the reactor; supplying oxygen gas to the reactor; purging the oxygen gas from the reactor; supplying hydrogen gas activated with plasma to the reactor; and purging the hydrogen gas from the reactor. The second ruthenium film may be formed by the ALD process including steps of: supplying a second ruthenium source gas to a reactor where the substrate is loaded; purging the second ruthenium source gas from the reactor; supplying a third reaction gas to the reactor; and purging the third reaction gas from the reactor.

The second ruthenium film may be formed by the ALD process including steps of supplying a second ruthenium source gas to a reactor where the substrate is loaded, and supplying a third reaction gas to the reactor. The third reaction gas may include oxygen.

The first ruthenium source gas may be a ruthenium compound represented by a general formula of $Ru[C_5H_3R^1R^2][C_5H_3R^3R^4]$ ($R^1$, $R^2$, $R^3$, $R^4$=H or an alkyl group $C_nH_{2n+1}$ (n=1~4)). The second ruthenium source gas may be a ruthenium compound represented by a general formula of $Ru[C_5H_3R^1R^2][C_5H_3R^3R^4]$ ($R^1$, $R^2$, $R^3$, $R^4$=H or an alkyl group $C_nH_{2n+1}$ (n=1~4)).

According to another embodiment, a method of depositing a ruthenium film includes steps of: mounting a semiconductor substrate in a reactor; depositing a first ruthenium film on the substrate by using a PEALD process; and depositing a second ruthenium film on the first ruthenium film by using an ALD process, wherein densities of the first and second ruthenium films are in a range of from about 10 g/cm³ to about 13 g/cm³.

The step of depositing the first ruthenium film by using the PEALD process may include steps of: supplying a first ruthenium source gas to the reactor; purging the first ruthenium source gas from the reactor; supplying a first reaction gas that is activated with plasma to the reactor; and purging the first reaction gas from the reactor, wherein the step of depositing the first ruthenium film repeats until a surface of the substrate is entirely covered with ruthenium.

The step of depositing the first ruthenium film by using the PEALD process may include steps of: supplying a first ruthenium source gas to the reactor; purging the first ruthenium source gas from the reactor; supplying a first reaction gas to the reactor; purging the first reaction gas from the reactor; supplying a second reaction gas that is activated with plasma to the reactor; and purging the second reaction gas from the reactor, wherein the step of depositing the first ruthenium film repeats until a surface of the substrate is entirely covered with ruthenium.

The first ruthenium source gas may be a ruthenium compound represented by a general formula of $Ru[C_5H_3R^1R^2][C_5H_3R^3R^4]$ ($R^1$, $R^2$, $R^3$, $R^4$=H or an alkyl group $C_nH_{2n+1}$ (n=1~4)). The first reaction gas may be a mixture gas of nitrogen and hydrogen. The first reaction gas may be ammonia gas. The first reaction gas may be oxygen gas. The second reaction gas may be hydrogen gas.

The step of depositing the second ruthenium film by using the ALD process may include steps of supplying a second ruthenium source gas to the reactor and supplying a third reaction gas to the reactor, wherein a deposition speed of the second ruthenium film is higher than that of the first ruthenium film. The second ruthenium source gas may be a ruthenium compound represented by a general formula of Ru[$C_5H_3R^1R^2$] [$C_5H_3R^3R^4$] ($R^1$, $R^2$, $R^3$, $R^4$=H or an alkyl group $C_nH_{2n+1}$ (n=1~4)). The third reaction gas may include oxygen.

A thickness of the first ruthenium film may be about 5 nm or less. A thickness of the second ruthenium film may be in a range of from about 5 nm to about 50 nm. The deposition duration of the second ruthenium film may be about 2 seconds or less. The deposition temperatures of the first and second ruthenium films may be about 400° C. or less. The deposition temperatures of the first and second ruthenium films may be in a range of from about 250° C. to about 350° C.

According to another embodiment, a method of depositing a ruthenium film includes steps of: mounting a semiconductor substrate in a reactor; depositing a first ruthenium film by repeating steps of supplying a first ruthenium source gas to the reactor, purging the first ruthenium source gas from the reactor, supplying a first reaction gas that is activated with plasma to the reactor, and purging the first reaction gas from the reactor; and depositing a second ruthenium film by repeating steps of supplying a second ruthenium source gas to the reactor and supplying a second reaction gas to the reactor. The deposition speed of the second ruthenium film is higher than that of the first ruthenium film, and densities of the first and second ruthenium films are in a range of from about 10 g/cm³ to about 13 g/cm³.

The first and second ruthenium source gases may be ruthenium compounds represented by a general formula of Ru[$C_5H_3R^1R^2$] [$C_5H_3R^3R^4$] ($R^1$, $R^2$, $R^3$, $R^4$=H or an alkyl group $C_nH_{2n+1}$ (n=1~4)). The first reaction gas may be ammonia gas or a mixture gas of nitrogen and hydrogen, and the second reaction gas may be oxygen. The deposition temperatures of the first and second ruthenium films may be about 400° C. or less. The deposition temperatures of the first and second ruthenium films may be in a range of from about 250° C. to about 350° C.

According to another embodiment, a method of depositing a ruthenium film includes steps of: mounting a semiconductor substrate in a reactor; depositing a first ruthenium film by repeating steps of supplying a first ruthenium source gas to the reactor, purging the first ruthenium source gas from the reactor, supplying a first reaction gas to the reactor, purging the first reaction gas from the reactor, supplying a second reaction gas that is activated with plasma to the reactor, and purging the second reaction gas from the reactor; and depositing a second ruthenium film by repeating steps of supplying a second ruthenium source gas to the reactor and supplying an inert gas to the reactor; supplying a third reaction gas to the reactor; and supplying an inert gas to the reactor. The deposition speed of the second ruthenium film is higher than that of the first ruthenium film, and densities of the first and second ruthenium films are in a range of from 10 g/cm³ to 13 g/cm³.

The first and second ruthenium source gases may be ruthenium compounds represented by a general formula of Ru[$C_5H_3R^1R^2$] [$C_5H_3R^3R^4$] ($R^1$, $R^2$, $R^3$, $R^4$=H or an alkyl group $C_nH_{2n+1}$ (n=1~4)). The first and third reaction gases may be oxygen gas, and the second reaction gas may be hydrogen gas. The deposition temperatures of the first and second ruthenium films may be about 400° C. or less. The deposition temperatures of the first and second ruthenium films may be in a range of from about 250° C. to about 350° C.

BRIEF DESCRIPTION OF THE DRAWINGS

The above and other features and advantages will become more apparent by describing in detail exemplary embodiments thereof with reference to the attached drawings, in which.

DETAILED DESCRIPTION OF EMBODIMENTS

Hereinafter, exemplary embodiments will be described in detail with reference to the attached drawings. However, the invention is not limited to the embodiments but may be implemented in various forms.

In embodiments described below, while a gas supplying cycle of sequentially supplying a ruthenium source gas and a reaction gas is carried out for an ALD process, an inert gas such as argon (Ar) or nitrogen gas ($N_2$) may be continuously supplied, including purge periods between ruthenium source and reaction gas pulses. Such inert gases may minimize or prevent the ruthenium gas and the reaction gas from being mixed with each other. Hydrogen gas ($H_2$), nitrogen gas ($N_2$), and a mixture thereof, which are reactive only in the plasma state thereof, may be used as a purging gas for purging the ruthenium source gas from a reactor. Instead of or in addition to the purging gas, a vacuum pump may be used to exhaust or remove the ruthenium source gas from the reactor. Detailed description of general techniques and apparatuses employed for the ALD process will be omitted, as they can vary and will be understood by the skilled artisan.

In the drawings, thicknesses are exaggerated for the purpose of clearly illustrating layers and areas. In addition, identical or functionally similar elements are denoted by like reference numerals throughout the specification. If it is mentioned that a layer, a film, an area, or a plate is placed on a different element, it may include the situation in which the layer, film, area, or plate is placed directly on the different element, as well as the situation in which another element is interposed therebetween. On the other hand, if it is mentioned that one element is placed directly on another element, it means that no element is interposed therebetween.

Figure 2A:
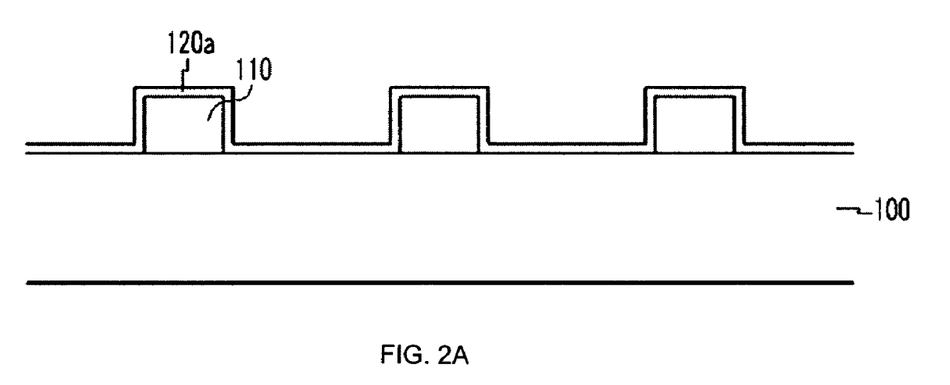
FIGS. 2A and 2B are cross-sectional views showing a ruthenium (Ru) structure formed by a ruthenium film deposition method according to one embodiment.
Figure 2B:
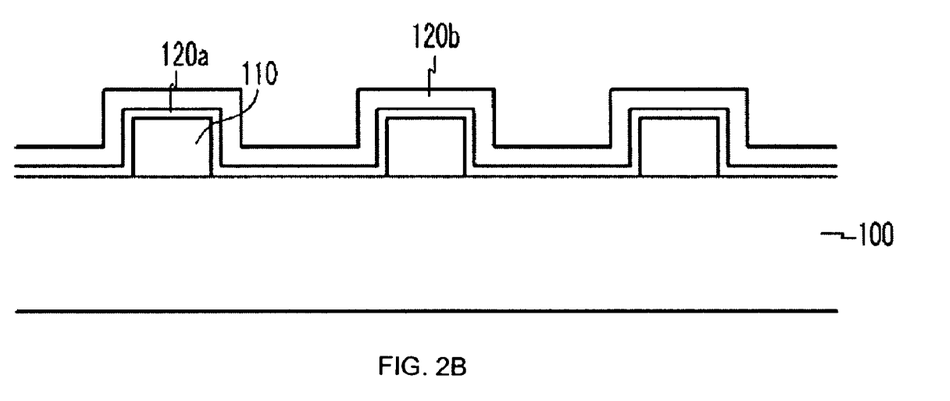

A ruthenium film deposition method according to one embodiment will now be described in detail with reference to FIGS. 2A and 2B. FIGS. 2A and 2B are cross-sectional views showing ruthenium films formed by the ruthenium film deposition method.

In the illustrated embodiment, as shown in FIG. 2A, a first ruthenium film 120a is deposited by a PEALD process on a substrate 100 having a plurality of devices 110. In the deposition of the first ruthenium film 120a, a gas supplying cycle of the PEALD process is repeated until a surface of the substrate 100 is substantially entirely covered with the ruthenium film. Here, the deposition of the first ruthenium film 120a may be conducted at a temperature of about 400° C. or less, and particularly from about 250° C. to about 350° C. The first ruthenium film 120a may have a density of about 12.0 g/cm$^3$, and a thickness of about 5 nm or less.

The PEALD gas supplying cycle may include a ruthenium source gas supplying step, an inert gas purging step, a plasma-activated ammonia gas (NH$_3$) supplying step, and an inert gas purging step. Instead of the ammonia gas (NH$_3$), a mixture of hydrogen gas (H$_2$) and nitrogen gas (N$_2$) may be used during the plasma activation. In the illustrated embodiment, oxygen gas (O$_2$) is not used. Thus, it is possible to substantially entirely cover the substrate with the ruthenium film without oxidizing the substrate.

In another embodiment, the PEALD gas supplying cycle may include a ruthenium source gas supplying step, an oxygen gas (O$_2$) supplying step, an inert gas purging step, a plasma-activated hydrogen gas (H$_2$) supplying step, and another inert gas purging step.

The ruthenium source gas may be a ruthenium compound represented by the formula of Ru[C$_5$H$_3$R$^1$R$^2$] [C$_5$H$_3$R$^3$R$^4$], where each of R$^1$, R$^2$, R$^3$, and R$^4$ is H or an alkyl group C$_n$H$_{2n+1}$ (n is an integer of 1 to 4). Particularly, Ru(Cp)$_2$ [where each of R$^1$, R$^2$, R$^3$, and R$^4$ is H], Ru(EtCp)$_2$ [each of R$^1$ and R$^3$ is H; each of R$^2$ and R$^4$ is C$_2$H$_5$], and Ru(MeCp)(EtCp) [each of R$^1$ and R$^3$ is H; R$^2$ is CH$_3$; R$^4$ is C$_2$H$_5$] may be used as the ruthenium source. In addition, tri(octandionato) ruthenium, Ru(OD)$_3$, or other ruthenium compounds may be used as the ruthenium source.

Next, as shown in FIG. 2B, a second ruthenium film 120b is deposited on the first ruthenium film 120a by an ALD process which does not use plasma. As used herein, a non-plasma ALD process is referred to as a thermal ALD process. Here, a gas supplying cycle of the ALD process may include a ruthenium source gas supplying step, an inert gas purging step, an oxygen gas (O$_2$) supplying step, and another inert gas purging step. The gas supplying cycle of the ALD process is repeated until a ruthenium film having a desired thickness is formed. Here, the deposition of the second ruthenium film 120b may be conducted at a temperature of about 400° C. or less, and particularly from about 250° C. to about 350° C. The second ruthenium film 120b may have a density of about 12.0 g/cm$^3$, and a thickness of about 5 nm to about 50 nm. In addition, in the embodiment, the ALD process may include a ruthenium source gas supplying step and an oxygen gas (O$_2$) supplying step. In one embodiment, the time interval of the ruthenium source gas supplying step does not exceed about 2 seconds.

Although oxygen gas (O$_2$) is used in the second ruthenium film deposition step, since the substrate has been substantially entirely covered with the ruthenium film without using oxygen gas (O$_2$) in the first ruthenium film deposition step, it is possible to suppress oxidation of the substrate.

Figure 2C:
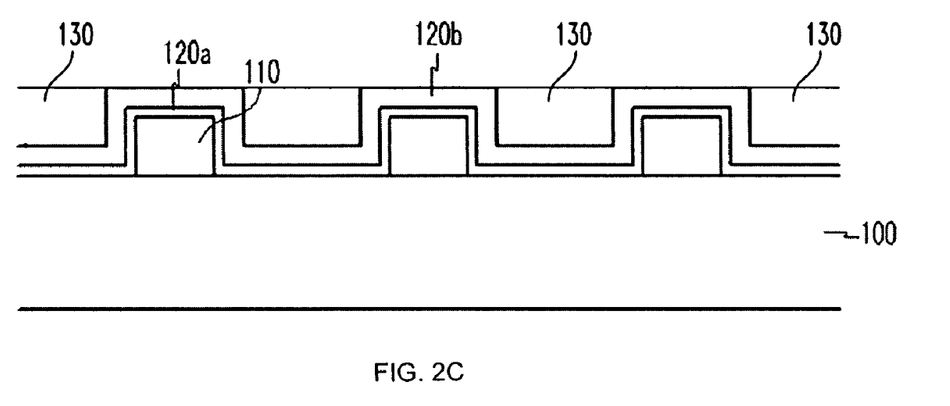
FIG. 2C is a cross-sectional view showing copper in relation to the Ru structure of FIG. 2B.

Subsequently, copper may be deposited on the second ruthenium film 120b so as to overfill trenches among the plurality of devices 110. Then, excess copper may be removed by any suitable technique, including but not limited to, chemical polishing (CP), chemical mechanical polishing (CMP), electrochemical polishing (ECP), and electrochemical mechanical polishing (ECMP), to leave copper lines. The resulting structure is shown in FIG. 2C. It will be appreciated that various other configurations of structures including copper and Ru films are also possible. For example, a metal nitride layer may intervene between the Ru bilayer and the insulator, or between the Ru bilayer and the copper lines.

Figure 3:
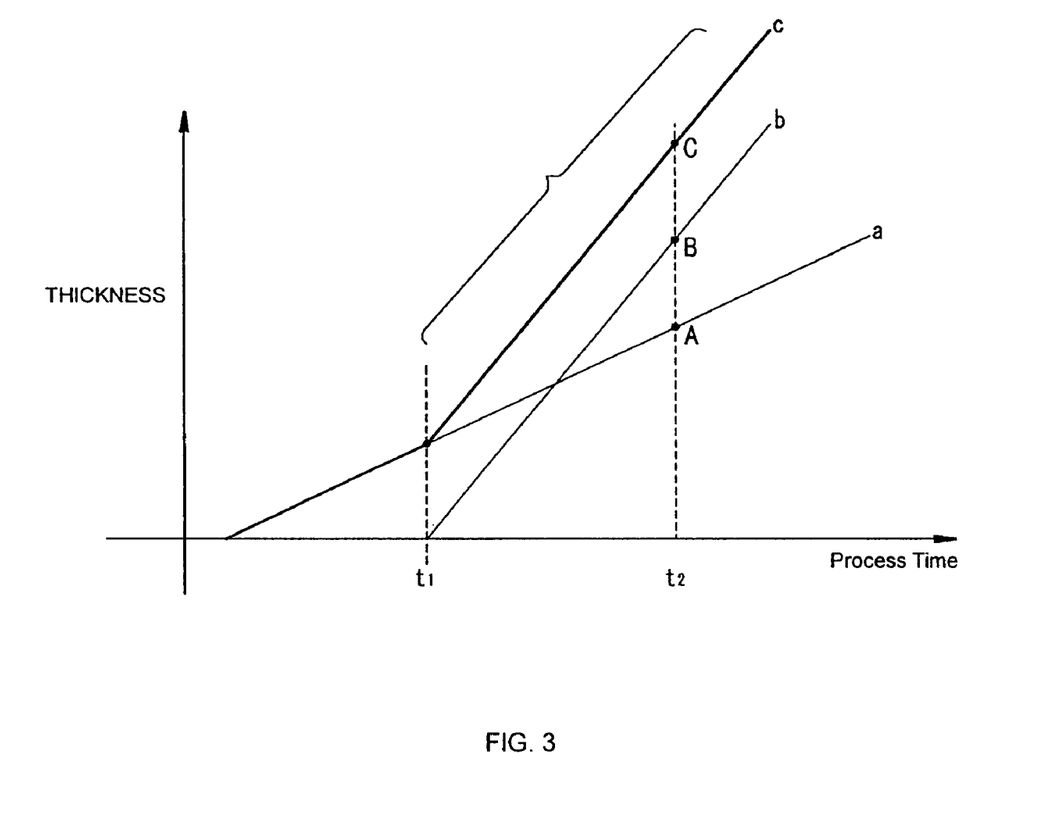
FIG. 3 is a graph showing a relationship between process time and the thickness of a ruthenium film formed by a ruthenium film deposition method according to another embodiment.

Now, a ruthenium film deposition method according to the embodiment will be briefly described with reference to FIG. 3. FIG. 3 is a graph showing a relationship between process time and the thickness of a ruthenium film formed by the ruthenium film deposition method described above.

In FIG. 3, line (a) shows a thickness of a ruthenium film formed by a PEALD process, with respect to process time. Line (b) shows the thickness of a ruthenium film formed by a thermal ALD process (also referred to herein as a non-plasma ALD process) that does not use plasma, with respect to deposition time. The bold line (c) shows a thickness of a ruthenium film formed by a deposition method according to the embodiment described above, with respect to deposition time. Here, t1 denotes reaction time, that is, time when a surface of a substrate is substantially entirely covered with a ruthenium film.

As shown in FIG. 3, during an initial time interval (incubation period) from 0 to t1, in the thermal ALD process indicated by line (a), no ruthenium film is deposited. However, in the deposition method according to the embodiment indicated by line (c), a ruthenium film substantially entirely covering the substrate is deposited as an initial film.

Referring to FIG. 3, a first ruthenium film is deposited during the incubation period 0 to t1 of the PEALD process. Thereafter, a second ruthenium is deposited by the thermal ALD process. However, the time when the second ruthenium film formation starts need not be the time t1. If the substrate is not substantially entirely covered with the first ruthenium film, the first ruthenium film deposition step may be continued even after the time t1. On the other hand, if the substrate has already been substantially entirely covered with the first ruthenium film, the incubation period for the first ruthenium film can be terminated prior to the time t1 so that the second ruthenium film deposition step may start. If a ruthenium film having a predetermined thickness is needed to prevent oxidation of the underlying substrate, the first ruthenium film having the predetermined thickness may be formed, and thereafter, the second ruthenium film deposition step may start using the ALD process using a gas containing oxygen.

In addition, in a case where the gas supplying cycle of the PEALD process is substantially equal to the gas supplying cycle of the thermal ALD process, the ruthenium deposition method (C) according to the embodiment can form a thicker ruthenium film for the same process time (i.e., faster or higher net deposition rate) than either the ruthenium film deposition method (A) using only the PEALD process or the ruthenium film deposition method (B) using only the thermal ALD process.

More specifically, in the ruthenium film deposition method according to the embodiment, during the initial film formation time interval 0 to t1, the first ruthenium film is deposited by the PEALD process, and after the initial film formation time interval, the second ruthenium film having a desired thickness is deposited by the thermal ALD process. As a result, in the ruthenium film deposition method according to the embodiment, it is possible to deposit the ruthenium film at a higher film deposition rate in comparison to the ruthenium film deposition methods using only the PEALD process or the thermal ALD process.

In addition, the ruthenium film deposition method using the PEALD process can form a ruthenium film having a higher density than the ruthenium film deposition method using either the CVD process or the thermal ALD process. Further, in the ruthenium film deposition method of depositing a first high-density ruthenium film by the PEALD process and subsequently depositing a second ruthenium film by the thermal ALD process or the CVD process, the density of a completed ruthenium bilayer or structure is equal to that of the first high-density ruthenium film.

Therefore, in the ruthenium film deposition method according to the embodiment, the top surface of the substrate is covered with a first ruthenium film having a high density by PEALD process, and thereafter, a second ruthenium film is deposited on the first ruthenium film by the thermal ALD process. As a result, it is possible to form a ruthenium film having a high density in a short period of time.

In another embodiment, a first ruthenium film may be formed by using a PEALD process that does not use a gas containing oxygen, and thereafter, a second ruthenium film may be formed by a thermal ALD process that uses a gas containing oxygen. As a result, it is possible to form a ruthenium film having a high density in a short period of time without oxidation of the substrate.

Particularly, in a case where a ruthenium film having a high density and a thickness of about 5 nm or more is formed in a structure having a large aspect ratio, for example, an electrode structure for semiconductor devices such as DRAMs and FeRAMs, it is preferable that the substrate is covered with the first ruthenium film by the PEALD process, and thereafter, the second ruthenium film is deposited on the first ruthenium film by the thermal ALD process. Therefore, if the second ruthenium film is deposited on the first ruthenium film by the thermal ALD process, it is possible to obtain a ruthenium film having excellent step coverage.

As described above, the density of the second ruthenium film deposited by the ALD process is substantially equal to that of the first ruthenium film formed by the PEALD process. Therefore, in a case where step coverage is not considered to be a critical issue due to a small aspect ratio of a structure where a ruthenium film is deposited, when the second ruthenium film is formed by using the thermal ALD process, the time for the inert gas purging step may be reduced so as to shorten the gas supplying cycle so that it is possible to increase the ruthenium film deposition speed per unit time, effectively introducing a CVD reaction mode component to the thermal ALD process. In another embodiment, the inert gas purging step may be omitted, so that the second ruthenium film can be formed by alternately supplying the ruthenium source gas and the reaction gas. In these cases, it is also possible to obtain a ruthenium film having better step coverage than a case of the CVD process of simultaneously supplying the ruthenium source gas and the reaction gas, as the deposition is effectively a hybrid of thermal ALD and CVD, with step coverage and deposition rate compromised between those of ALD and CVD.

Figure 4:
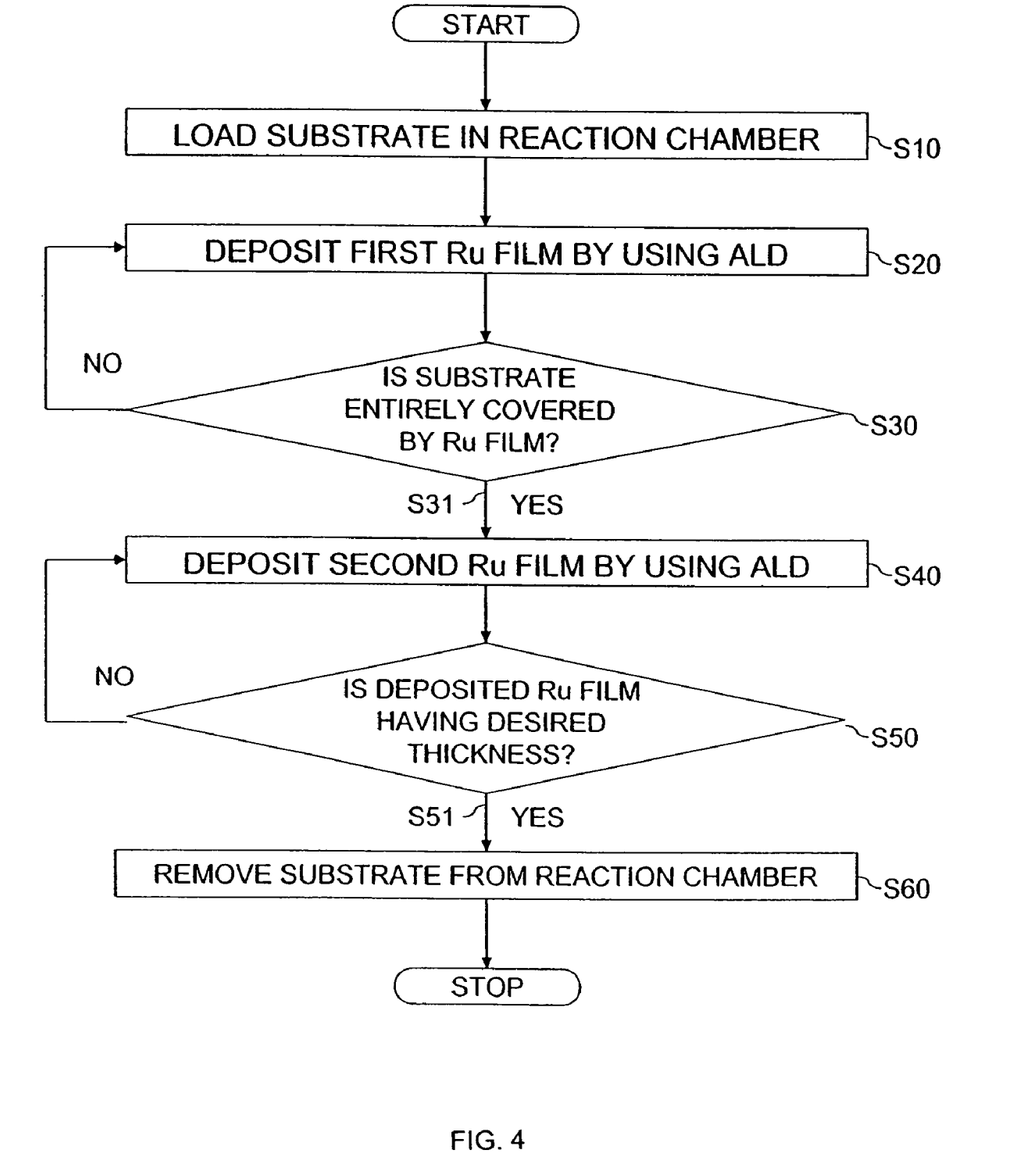
FIG. 4 is a flowchart of a ruthenium film deposition method according to another embodiment.

Now, a ruthenium film deposition method according to the embodiment will be briefly described with reference to FIG. 4. FIG. 4 is a flowchart of a ruthenium film deposition method according to the embodiment.

Referring to FIG. 4, a substrate where a ruthenium film is to be deposited is loaded into a reaction chamber (S10). Next, a first ruthenium film is deposited on the substrate by an ALD cycle (S20) having a high nucleation rate but relatively low deposition rate after nucleation, preferably PEALD. The first ruthenium film deposition cycle is repeated until the substrate is substantially entirely covered with the ruthenium film (S30). If the substrate is substantially entirely covered with the ruthenium film (S31), a second ruthenium film is deposited on the first ruthenium film by a ruthenium deposition method (S40) having a low nucleation rate on oxides, but relatively higher deposition rate, in the illustrated embodiment comprising a thermal ALD process. A ruthenium source gas supplying cycle of the ALD cycle (S40) is repeated until the ruthenium film has a desired thickness (S50). If the ruthenium film has a desired thickness, the substrate is unloaded from the reaction chamber (S60), so that the deposition method is completed.

In this way, a ruthenium film having a high density is formed as an initial film by the PEALD process, and thereafter, another ruthenium film having a desired thickness is deposited thereon by the thermal ALD process. This method provides a ruthenium film having a higher density and a lower impurity concentration at a lower process temperature of about 500° C. or less, particularly about 400° C. or less, and more particularly from about 250° C. to about 350° C., compared to a ruthenium film formed by using a conventional CVD process at a process temperature of about 500° C.

In the ruthenium film deposition method according to the embodiment, a first ruthenium film is formed as an initial film at a high film deposition speed by the PEALD process, and thereafter, a second ruthenium film is deposited on the first ruthenium film at a higher film deposition speed by the thermal ALD process. As a result, in the ruthenium film deposition method according to the embodiment, it is possible to form a ruthenium film having a high density in a short period of time by combining the PEALD process of depositing a ruthenium film having a high density at a low deposition speed and the thermal ALD process of depositing a ruthenium film at a high deposition speed.

In this way, in the ruthenium film deposition method according to the embodiment, it is possible to obtain a ruthenium film having a high density, a smooth surface, good adhesiveness, and a short incubation period. Therefore, according to the embodiments, in comparison to cases of using only the PEALD process or the thermal ALD process having a long incubation period, it is possible to obtain a ruthenium film having a large thickness and a high density for the same deposition time. As a result, the ruthenium film formed by the ruthenium film deposition method according to the embodiment is more suitable for electrode structures of semiconductor devices than the ruthenium films formed by using the conventional methods.

In comparison to the ruthenium film deposition method using only the PEALD process or the thermal ALD process, it is possible to obtain a ruthenium film having a high density and excellent step coverage with a desired thickness at a higher deposition speed.

In addition, according to the embodiment, a first ruthenium film may be formed by the PEALD process that does not use a gas containing oxygen. Thereafter, a second ruthenium film may be formed by the ALD process that uses a gas containing oxygen. Thus, it is possible to form a ruthenium film having a high density in a short period of time without oxidation of a substrate.

Further, in the ruthenium film deposition method according to the embodiment, the initial PEALD process and the thermal ALD process can be simply performed in a single ALD rector. Thus, reactors disclosed in U.S. Pat. No. 7,138, 336, entitled "PEALD equipment and method of forming a conducting thin film using the same thereof" and U.S. patent application Ser. No. 11/318,786, entitled "Atomic layer deposition apparatus" can be used.

In the embodiments described above, the ruthenium films can be deposited using in-situ plasma. A skilled artisan will appreciate that various in-situ plasma processes can be adapted for depositing the Ru films described above.

According to the embodiments described above, it is possible to form a ruthenium film having a high density at a high deposition speed. In addition, it is possible to form a ruthenium film having an excellent step coverage that is suitable to be used as an electrode material for a structure having a large aspect ratio of a semiconductor device. Further, it is possible to form a ruthenium film without oxidation of a substrate. In addition, a thick ruthenium film having a thickness of about 10 nm to about 20 nm can be formed by shortening an incubation period by using a PEALD process and reducing a gas supplying cycle by using an ALD process. Thus, it is possible to improve productivity of the processes and the associated production apparatuses.

Although the exemplary embodiments and the modified examples have been described, the invention is not limited to the embodiments and examples, but may be modified in various forms without departing from the scope of the appended claims, the detailed description, and the accompanying drawings.

What is claimed is:

1. A method of depositing a ruthenium film, the method comprising:
    loading a substrate into a reactor;
    depositing a first ruthenium layer over the substrate by a plasma enhanced atomic layer deposition (PEALD) process; and
    depositing a second ruthenium layer over the first ruthenium layer by an atomic layer deposition (ALD) process without using plasma.

2. The method of claim 1, wherein depositing the first ruthenium layer comprises depositing the first ruthenium layer at a first deposition rate, and wherein depositing the second ruthenium layer comprises depositing the second ruthenium layer at a second deposition rate greater than the first deposition rate.

3. The method of claim 1, wherein depositing the first ruthenium layer comprises a plurality of cycles comprising:
    supplying a first ruthenium source gas to the reactor;
    purging the first ruthenium source gas from the reactor;
    supplying a first reaction gas to the reactor; and
    purging the first reaction gas from the reactor, and
    wherein depositing the first ruthenium layer is repeated until a surface of the substrate is substantially entirely covered with ruthenium.

4. The method of claim 3, wherein supplying the first reaction gas comprises activating the first reaction gas with plasma.

5. The method of claim 3, wherein the first ruthenium source gas comprises a ruthenium compound represented by the formula of $Ru[C_5H_3R^1R^2][C_5H_3R^3R^4]$, wherein each of $R^1$, $R^2$, $R^3$, and $R^4$ is H or an alkyl group $C_nH_{2n+1}$, and wherein n is an integer of 1 to 4.

6. The method of claim 3, wherein the first reaction gas comprises at least one of $N_2/H_2$ and ammonia gas ($NH_3$).

7. The method of claim 3, wherein depositing the first ruthenium layer further comprises, after purging the first reaction gas:
    supplying a second reaction gas to the reactor; and
    purging the second reaction gas from the reactor.

8. The method of claim 7, wherein supplying the first reaction gas does not comprise activating the first reaction gas with plasma, and wherein supplying the second reaction gas comprises activating the second reaction gas with plasma.

9. The method of claim 7, wherein the first reaction gas comprises oxygen gas.

10. The method of claim 7, wherein the second reaction gas comprises hydrogen gas.

11. The method of claim 3, wherein depositing the second ruthenium layer comprises:
    supplying a second ruthenium source gas to the reactor; and
    supplying a third reaction gas to the reactor.

12. The method of claim 11, wherein depositing the second ruthenium layer further comprises:
    purging the second ruthenium source gas from the reactor after supplying the second ruthenium source gas; and
    purging the third reaction gas from the reactor after supplying the third reaction gas.

13. The method of claim 12, wherein purging the second ruthenium source gas comprises supplying an inert gas to the reactor, and wherein purging the third reaction gas comprises supplying an inert gas to the reactor.

14. The method of claim 11, wherein the second ruthenium source gas comprises a ruthenium compound represented by the formula of $Ru[C_5H_3R^1R^2][C_5H_3R^3R^4]$, wherein each of $R^1$, $R^2$, $R^3$, and $R^4$ is H or an alkyl group $C_nH_{2n+1}$, and wherein n is an integer of 1 to 4.

15. The method of claim 11, wherein the third reaction gas comprises oxygen gas.

16. The method of claim 15, wherein the first reaction gas comprises at least one of $N_2/H_2$ and $NH_3$.

17. The method of claim 15, wherein depositing the first ruthenium layer further comprises supplying a second reaction gas to the reactor after purging the first reaction gas, wherein the first reaction gas comprises oxygen gas, and wherein the second reaction gas comprises hydrogen gas.

18. The method of claim 1, wherein depositing the first ruthenium layer comprises depositing the first ruthenium layer to a thickness of about 5 nm or less.

19. The method of claim 1, wherein depositing the second ruthenium layer comprises depositing the second ruthenium layer to a thickness of about 5 nm to about 50 nm.

20. The method of claim 1, wherein depositing the second ruthenium layer comprises depositing the second ruthenium layer for a period of about 2 seconds or less.

21. The method of claim 1, wherein depositing the first ruthenium layer comprises depositing the first ruthenium layer at a temperature of about 400° C. or less, and wherein depositing the second ruthenium layer comprises depositing the second ruthenium layer at a temperature of about 400° C. or less.

22. The method of claim 21, wherein depositing the first ruthenium layer comprises depositing the first ruthenium layer at a temperature of about 250° C. to about 350° C., and wherein depositing the second ruthenium layer comprises depositing the second ruthenium layer at a temperature of about 250° C. to about 350° C.

23. The method of claim 1, further comprising continuously supplying an inert gas to the reactor.

24. A semiconductor device, comprising:
    a substrate; and
    a ruthenium film formed over the substrate, the film comprising:
        a first ruthenium layer formed over the substrate; and
        a second ruthenium layer formed on the first ruthenium layer,
        wherein each of the first and second ruthenium layers has a density of about 10 g/cm$^3$ to about 13 g/cm$^3$.

25. A ruthenium bilayer structure comprising:
    a first ruthenium layer formed over a substrate; and
    a second ruthenium layer formed directly on the first ruthenium layer, wherein each of the first and second ruthenium layers has a density of about 10 g/cm$^3$ to about 13 g/cm$^3$.

26. A method of depositing a ruthenium film, the method comprising:

providing a substrate into a reactor;

depositing a first ruthenium layer over the substrate at a first deposition rate by a plasma enhanced atomic layer deposition (PEALD) process; and depositing a second ruthenium layer over the first ruthenium layer at a second deposition rate by an atomic layer deposition (ALD) process, the second deposition rate being greater than the first deposition rate.

27. An electronic device comprising the semiconductor device of claim 24.

28. The method of claim 26, wherein depositing the first ruthenium layer comprises depositing the first ruthenium layer substantially without supplying oxygen gas to the reactor; and wherein depositing the second ruthenium layer comprises supplying oxygen gas to the reactor.

29. The method of claim 26, wherein the ALD process comprises a thermal ALD process.

30. A method of depositing a ruthenium film, the method comprising:

providing a substrate into a reactor;

depositing a first ruthenium layer over the substrate by a plasma enhanced atomic layer deposition (PEALD) process; and depositing a second ruthenium layer over the first ruthenium layer by a non-plasma process, wherein the second ruthenium layer has substantially the same density as that of the first ruthenium layer, wherein each of the first and second ruthenium layers has a density of about 10 g/cm$^3$ to about 13 g/cm$^3$.

31. The method of claim 30, wherein the non-plasma process comprises a thermal ALD process.

32. The method of claim 30, wherein the non-plasma process comprises a CVD process.

* * * * *